United States Patent
Hirai (10) Patent No.: US 8,072,274 B2
(45) Date of Patent: Dec. 6, 2011

(54) OSCILLATION CIRCUIT

(75) Inventor: Kazunosuke Hirai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/654,356

(22) Filed: Dec. 17, 2009

(65) Prior Publication Data

US 2010/0164637 A1 Jul. 1, 2010

(30) Foreign Application Priority Data

Dec. 25, 2008 (JP) ................................ 2008-330485

(51) Int. Cl.
*H03B 1/00* (2006.01)

(52) U.S. Cl. ............ 331/57; 331/74; 331/183; 327/261; 327/156; 327/159

(58) Field of Classification Search .................... 331/57, 331/74, 183; 327/156, 159, 261
See application file for complete search history.

(56) References Cited

U.S. PATENT DOCUMENTS 5,903,195 A * 5/1999 Lukes et al. ...................... 331/4

FOREIGN PATENT DOCUMENTS

JP 2001-358565 12/2001

* cited by examiner

*Primary Examiner* — Arnold Kinkead
(74) *Attorney, Agent, or Firm* — McGinn IP Law Group, PLLC (57) ABSTRACT

A differential oscillation circuit according to the present invention is a differential oscillation circuit including a feedback loop circuit. The differential oscillation circuit includes: delay, circuits, cascade-connected one after another on the feedback loop circuit, each delay circuit configured to delay paired differential input signals which the delay circuit receives, and to output the delayed differential signals as paired differential output signals; and an oscillation activation detector circuit configured to detect whether the oscillation circuit is in an oscillation activation state or in a stable state, and to output a detection signal indicating a result of the detection. Furthermore, on the basis of the detection signal outputted from the oscillation activation detector circuit, each of the delay circuits controls output current values of the differential output signals. This circuit configuration enables the speeding up of the oscillation frequency of the circuit.

7 Claims, 9 Drawing Sheets

OSCILLATION CIRCUIT

BACKGROUND OF THE INVENTION

1. Field of the Invention

The present invention relates to an oscillation circuit, particularly to speeding-up of an oscillation circuit.

2. Description of Related Art

In recent years, the operating speed of CPUs and memory I/Fs in semiconductor integrated circuits has been progressively increased. Oscillation circuits capable of operating at high speed are used in a wide range of fields, including generation of clock signals for microprocessors and generation of carriers for mobile phones and the like. In this manner, high-speed operable oscillation circuits are essential for large-scale and high-speed data transfer and data processing. Nevertheless, the high-speed operation of the oscillation circuits is hindered by some factors such as an influence of currents which flow while oscillation of oscillation circuits is activated. In addition, it is very difficult to control currents flowing in the oscillation circuits. This being the case, a technology capable of easily controlling the currents flowing in oscillation circuits is demanded in order to enable the oscillation circuits to operate at high speed.

Figure 7:
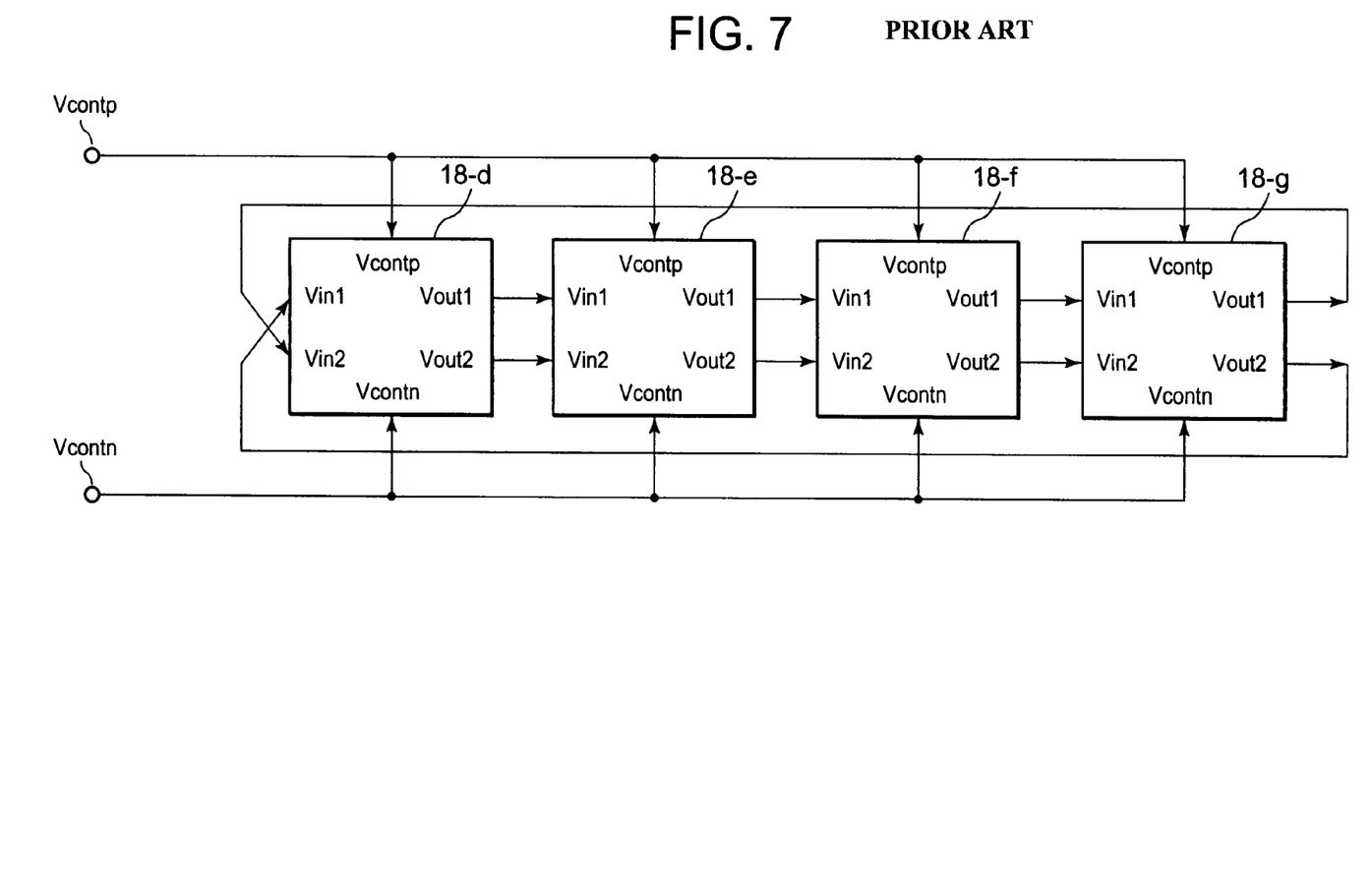
FIG. 7 is a diagram showing an oscillation circuit according to the prior art.
Figure 8:
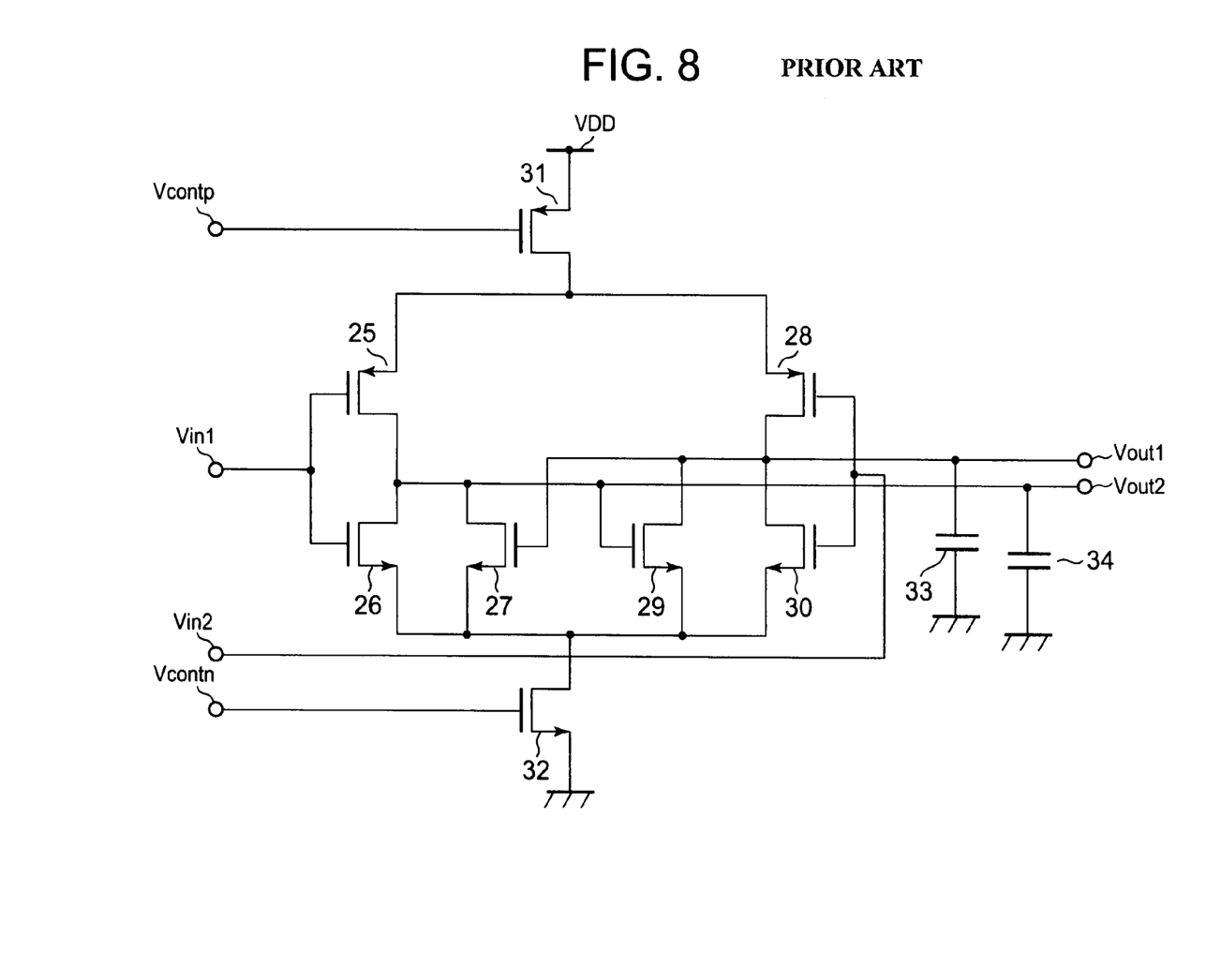
FIG. 8 is a diagram showing a delay circuit according to the prior art.

FIG. 7 shows an oscillation circuit described in Japanese Patent Application Publication No. 2001-358565 (JP 2001-358565 A). FIG. 8 shows a circuit configuration of a delay circuit constituting the oscillation circuit shown in FIG. 7. The delay circuit 18 includes: an amplifier (N-channel MOS transistor) 26 and an amplifier (N-channel MOS transistor) 27 which share a transistor (P-channel MOS transistor) 25; an amplifier (N-channel MOS transistor) 29 and an amplifier (N-channel MOS transistor) 30 which share a transistor (P-channel MOS transistor) 28; and a variable current generator (P-channel MOS transistor) 31 and a variable current generator (N-channel MOS transistor) 32 for controlling the amounts of currents flowing in the amplifiers 26, 27, 29, 30. In FIG. 8, reference signs Cs1 (33) and Cs2 (34) denote parasitic capacitances between the output terminals of the delay circuit 18 and the input terminals of another delay circuit at the following stage.

By use of signals inputted through the terminals Vin1, Vin2, the amplifiers 26, 30 and the transistors 25, 28 charge and discharge the parasitic capacitances Cs1, Cs2, and output signals, whose phases are reversed from those of these input signals, to terminals Vout1, Vout2. A positive feedback circuit including the amplifiers 27, 29 is provided to connect the output signals to each other. The gate of the amplifier 27 is connected to an output node where the drain of the transistor 28 and the drain of the amplifier 30 are connected together. The gate of the amplifier 29 is connected to an output node where the drain of the transistor 25 and the drain of the amplifier 26 are connected together.

Thereby, in this positive feedback circuit, the amplifier 27 amplifies a minute potential difference in the signal outputted from the amplifier 30, and outputs the amplified potential difference to an output terminal of the amplifier 26. Similarly, the amplifier 29 amplifies a minute potential difference in the signal outputted from the amplifier 26, and outputs the amplified potential difference to an output terminal of the amplifier 30. In addition, the variable current generator 31 is connected between the power supply voltage VDD, and the sources of the transistors 25, 28. The variable current generator 32 is connected between the ground voltage GND and the transistors 26, 27, 29, 30. In this respect, a current flowing through the variable current generator 31 is controlled on the basis of a voltage of a terminal Vcontp. Furthermore, a current flowing through the variable current generator 32 is controlled on the basis of a voltage of a terminal Vcontn. Thereby, the delay circuit 18 is capable of controlling a delay value of the signal output relative to the signal input.

As described above, even when the potential difference between the signals inputted from the terminals Vin1, Vin2 is minute, the amplifiers 27, 29 detect the signal difference and thus amplify its signal amplitude. Hence, the amplifiers 27, 29 forcedly operate differential pair outputs (voltages of the respective terminals Vout1, Vout2) at a voltage value of the power supply voltage or the ground voltage. In this manner, each delay circuit is capable of increasing its gain. For instance, even if the differential pair inputs to the terminals Vin1, Vin2 are both at the ground level, the amplifiers 27, 29 amplify a minute potential difference which occurs between the differential pair outputs due to device noise and the like. In addition, the amplifiers 27, 29 operate so that the differential pair outputs can be reverse-phase outputs. Furthermore, the amplifiers 26, 27 share the transistor 25, whereas the amplifiers 29, 30 share the load transistor 28. With this configuration, four amplifiers can be formed by use of the 6 transistors.

Next, descriptions will be provided for a configuration shown in FIG. 7. In FIG. 7, delay circuits 18-*d*, 18-*e*, 18-*f*, 18-*g* each with the configuration shown in FIG. 8 are cascade-connected one after another. An output terminal Vout1 of the delay circuit 18-*g* in the last stage is connected to an input terminal Vin2 of the delay circuit 18-*d*. In addition, an output terminal Vout2 of the delay circuit 18-*g* is connected to an input terminal Vin1 of the delay circuit 18-*d*.

Next, descriptions will be provided for an operation of the oscillation circuit shown in FIG. 7. For instance, when signals of an input terminals Vin1 and Vin2 of the delay circuit 18-*d* are at high level and at low level, respectively, signals of output terminals Vout1 and Vout2 of each of the delay circuits 18-*d*, 18-*e*, 18-*f*, 18-*g* are also at high level and at low level, respectively. Then, the output signals from the delay circuit 18-*g* are crossed over, and are thus fed back into the input terminals of the delay circuit 18-*d*. Specifically, the output terminal Vout1 of the delay circuit 18-*g* is connected to the input terminal Vin2 of the delay circuit 18-*d*, whereas the output terminal Vout2 of the delay circuit 18-*g* is connected to the input terminal Vin1 of the delay circuit 18-*d*. Consequently, the signal of the input terminal Vin1 of the delay circuit 18-*d* changes from high level to low level, whereas the signal of the input terminal Vin2 of the delay circuit 18-*d* changes from low level to high level.

Thereby, signals of the output terminals Vout1 of the delay circuits 18-*d*, 18-*e*, 18-*f*, 18-*g* sequentially change to the low level, whereas signals of the output terminals Vout2 of the delay circuits 18-*d*, 18-*e*, 18-*f*, 18-*g* sequentially change to high level. In addition, the feedback changes the signal of the terminal Vin1 of the delay circuit 18-*d* from low level to high level, and the signal of the terminal Vin2 of the delay circuit 18-*d* from high level to low level. The oscillation circuit oscillates by repeating this sequence. In this respect, by changing voltages of the terminals Vcontp, Vcontn, a current of each variable current generator in each delay circuit can be controlled, and thereby a delay value of each delay circuit can be controlled. In other words, the oscillation frequency of the oscillation circuit can be controlled.

Here, assume a case where, for instance, signals of the respective output terminals Vout1, Vout2 of the delay circuit 18-*d* are both at low level in the oscillation circuit according to JP 2001-358565 A shown in FIG. 7. In this case, signals of the output terminals Vout1, Vout2 of the delay circuit 18-*e* are both at high level; signals of the output terminals Vout1, Vout2 of the delay circuit 18-*f* are both at low level; and signals of the output terminals Vout1, Vout2 of the delay circuit 18-g are both at high level. In other words, this results in an activation state where the oscillation circuit does not oscillate (an oscillation stop state).

By use of the delay circuit shown in FIG. 8, descriptions will be hereinbelow provided for a setting to avoid the oscillation stop state. When signals of the input terminals Vin1, Vin2 are both at low level, the transistors 25, 28 are turned on. By this, a high-level signal is supplied to the gate of each of the transistors 27, 29. Thereby, the transistors 27, 29 are turned on. In this case, the delay circuit needs to have a circuit configuration in which the output terminals Vout1, Vout2 output signals whose phases are reverse to each other. Specifically, in order to activate oscillation of the oscillation circuit which is currently in the oscillation stop state, the transistor 27 constituting the third amplifier and the transistor 29 constituting the fourth amplifier each need to have a large differential gain. In other words, the transistors 27, 29 need to have a transistor configuration which is capable of sensitively responding to even a minute signal potential difference. In this case, the transistors 27, 29 need to be configured in a large transistor size so as to have a sufficiently large current capability.

Thus, the transistors 27, 29 constitute the differential amplifier for activating the oscillation of the oscillation circuit from the oscillation stop state, and continuously operate even when the oscillation circuit stably oscillates after the oscillation activation. However, the transistors 27, 29 hinder the oscillation circuit from oscillating at high-speed, because the transistors 27, 29 each have the sufficiently large current capability, as described above.

Figure 9:
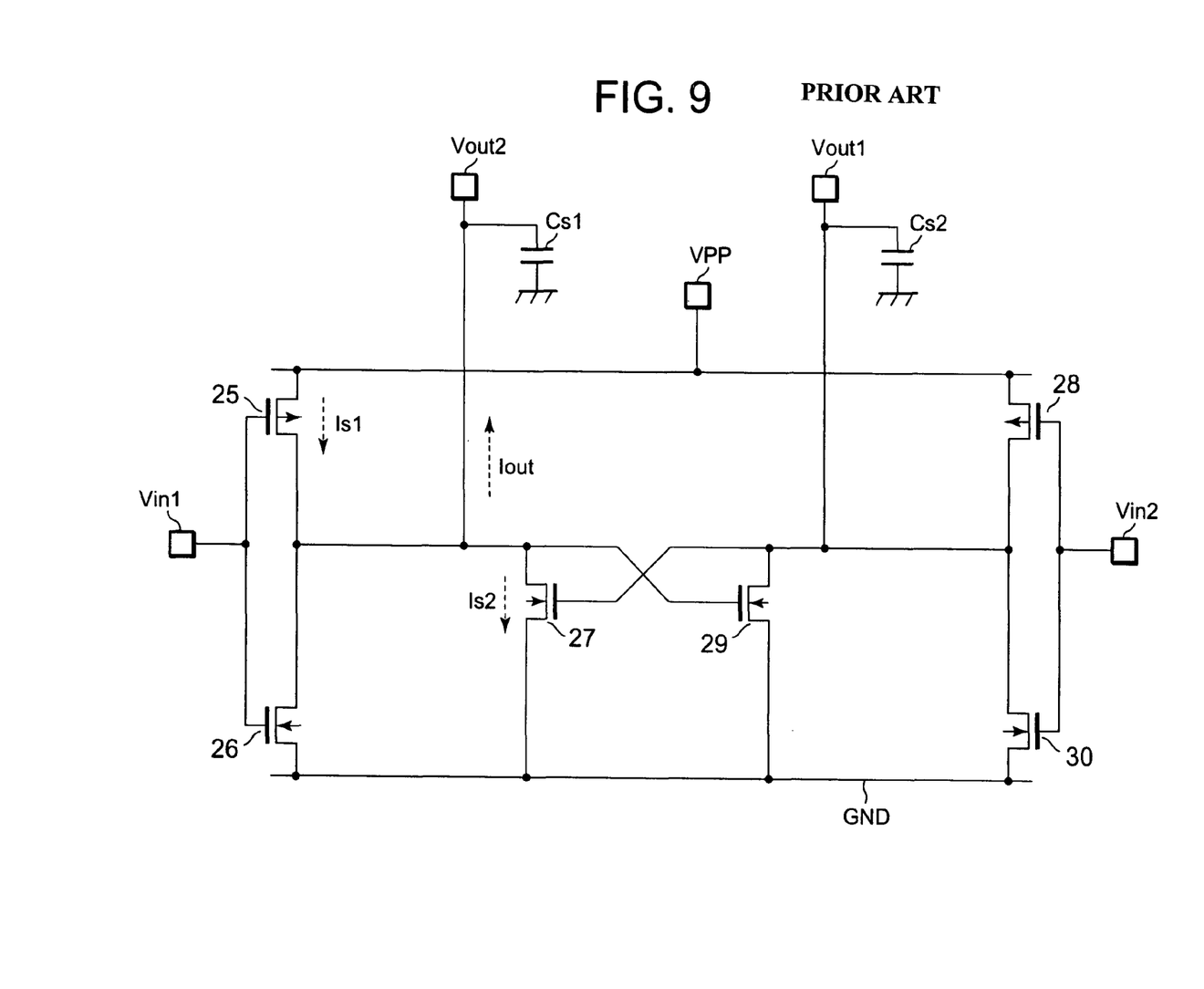
FIG. 9 is a diagram showing how a current flows in the delay circuit according to the prior art.

Hereinbelow, descriptions will be provided for a mechanism which causes the foregoing problem by use of FIG. 9. FIG. 9 shows how currents flow in a delay circuit constituting the oscillation circuit described in JP 2001-358565 A. Reference sign Is1 denotes a current flowing through the transistor 25; Is2, a current flowing through the transistor 27; and Iout, an output current flowing to the output terminal Vout2. In addition, reference signs Vin1, Vin2 denote the input terminals of the delay circuit; and reference sings Vout1, Vout2 denote the output terminals of the delay circuit. The transistors 31, 32 shown in FIG. 8 have no influence on the operation, and thus descriptions thereof will be omitted here. Furthermore, for the sake of explanatory convenience, a terminal connected to the sources of the transistors 25, 28 is denoted by reference sign Vpp, and a terminal connected to the sources of the transistors 26, 27, 29, 30 is denoted by reference sign GND.

While the transistor 27 is on, the current Is2 flows through the transistor 27. During this time, the output current Iout flowing to the output terminal Vout2 decreases. In other words, the output current Iout can be expressed with the current Is1 minus the current Is2. In the example shown in FIG. 9, the output current Iout decreases due to the current Is2 flowing when a signal of the output terminal Vout2 changes from low level to high level, that is, when a signal of the output terminal Vout1 changes from high level to low level.

In this respect, as publicly known, the oscillation frequency of the oscillation circuit 1 is proportional to the output current Iout and inversely proportional to the capacitance Cs1. For this reason, as the current Is2 becomes larger, the upper limit of the oscillation frequency becomes lower. In other words, as the current Is2 becomes larger, the speeding-up of the oscillation frequency of the oscillation circuit 1 is more limited. To address this, the current Is2 may be decreased by reducing a channel width W of the transistor 27. Once the current capacity of the transistor 27 is reduced, however, the oscillation circuit would have a difficulty in avoiding the oscillation stop state when activating its oscillation.

In the delay circuit shown in FIG. 8, as described above, a large amount of a current flows through each of the transistors 27, 29 even while the oscillation is stable. This hinders the oscillation circuit from oscillating at high-speed. On the other hand, reduction of the current capacity of each of the transistors 27, 29 by reduction in their transistor size is conceivable as a measure to achieve the speeding up of the oscillation of the oscillation circuit. However, this makes it difficult for the oscillation circuit to avoid the oscillation stop state when activating its oscillation.

As described above, the conventional oscillation circuit has a problem that the speeding up of the oscillation frequency is limited by some factors such as an influence of currents for amplifying oscillation signals.

SUMMARY

A differential oscillation circuit according to the present invention includes a feedback loop circuit, and comprises: delay circuits, cascade-connected one after another on the feedback loop circuit, each delay circuit configured to delay paired differential input signals which the delay circuit receives, and to output the delayed differential signals as paired differential output signals; and an oscillation activation detector circuit configured to detect whether the oscillation circuit is in an oscillation activation state or in a stable state, and to output a detection signal indicating a result of the detection. In the differential oscillation circuit, on a basis of the detection signal outputted from the oscillation activation detector circuit, each of the delay circuits controls output current values of the differential output signals.

The above-described circuit configuration makes it possible to speed up the oscillation frequency.

The present invention can provide an oscillation circuit which is capable of speeding up its oscillation frequency.

DETAILED DESCRIPTION OF THE PREFERRED EMBODIMENTS

Referring to the drawings, detailed descriptions will be hereinbelow provided for the concrete embodiments to which the present invention is applied. Throughout the drawings, the same components are denoted by the same reference sings. For the sake of explanatory simplification, redundant explanations are omitted as appropriate.

First Embodiment of the Invention

Figure 1:
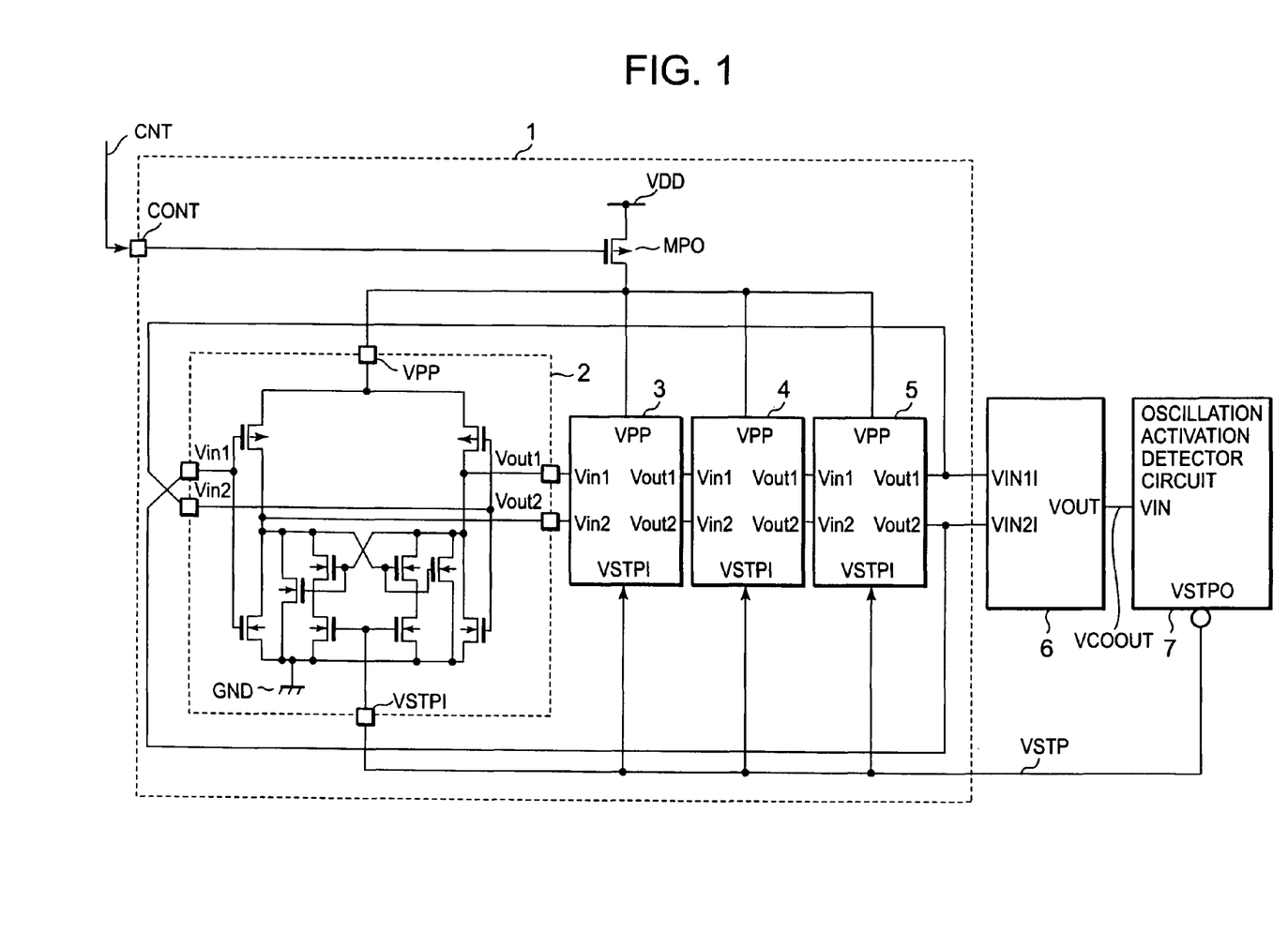
FIG. 1 is a diagram showing a differential oscillation circuit according to a first embodiment of the present invention.

Referring to the drawings, descriptions will be provided for a first embodiment of the present invention. FIG. 1 is a block diagram of a differential oscillation circuit (an oscillation circuit) according to the first embodiment of the present invention. The differential oscillation circuit shown in FIG. 1 employs a circuit configuration which includes: oscillation circuits 1 formed on the same semiconductor substrate; a differential single-end converter circuit 6; and an oscillation activation detector circuit 7 for detecting an oscillation activation. An output terminal Vout1 of a delay circuit 5 serving as a differential output of the oscillation circuit 1 is connected to an input terminal VIN1I of the differential single-end converter circuit 6. An output terminal Vout2 of the delay circuit 5 serving as the deferential output of the oscillation circuit 1 is connected to an input terminal VIN2I of the differential single-end converter circuit 6.

An output terminal VOUT of the differential single-end converter circuit 6 is connected to an input terminal VIN of the oscillation activation detector circuit 7. An output terminal VSTPO of the oscillation activation detector circuit 7 is connected to input terminals (low-potential power supply terminals) VSTPI of the respective delay circuits 2, 3, 4, 5 included in the oscillation circuit 1. A power supply voltage terminal VDD is connected to the source of a transistor MP0. The transistor MP0 is a P-channel MOS transistor, for instance. The drain of the transistor MP0 is connected to input terminals (high-potential power supply terminals) VPP of the respective delay circuits 2, 3, 4, 5 included in the oscillation circuit 1. The gate of the transistor MP0 is connected to an input terminal CONT of the oscillation circuit 1. A voltage control signal CNT from the outside is inputted into the input terminal CONT of the oscillation circuit 1.

The oscillation circuit 1 is configured by including the delay circuits 2, 3, 4, 5 which are cascade-connected one after another. An output terminal Vout1 of the delay circuit 2 is connected to an input terminal Vin1 of the delay circuit 3. An output terminal Vout2 of the delay circuit 2 is connected to an input terminal Vin2 of the delay circuit 3. An output terminal Vout1 of the delay circuit 3 is connected to an input terminal Vin1 of the delay circuit 4. An output terminal Vout2 of the delay circuit 3 is connected to an input terminal Vin2 of the delay circuit 4. An output terminal Vout1 of the delay circuit 4 is connected to an input terminal Vin1 of the delay circuit 5. An output terminal Vout2 of the delay circuit 4 is connected to an input terminal Vin2 of the delay circuit 5. The output terminal Vout1 of the delay circuit 5 is connected to an input terminal Vin2 of the delay circuit 2. The output terminal Vout2 of the delay circuit 5 is connected to an input terminal Vin1 of the delay circuit 2.

Note that the present invention is not limited to the foregoing embodiment. The embodiment can be modified without departing from the spirit of the present invention whenever deemed necessary. For instance, the first embodiment of the present invention shows a case where the four delay circuits are included in the oscillation circuit 1. However, the present invention is not limited to this. As long as the oscillation circuit is capable of outputting oscillation signals, any number of delay circuits may be included.

Figure 3:
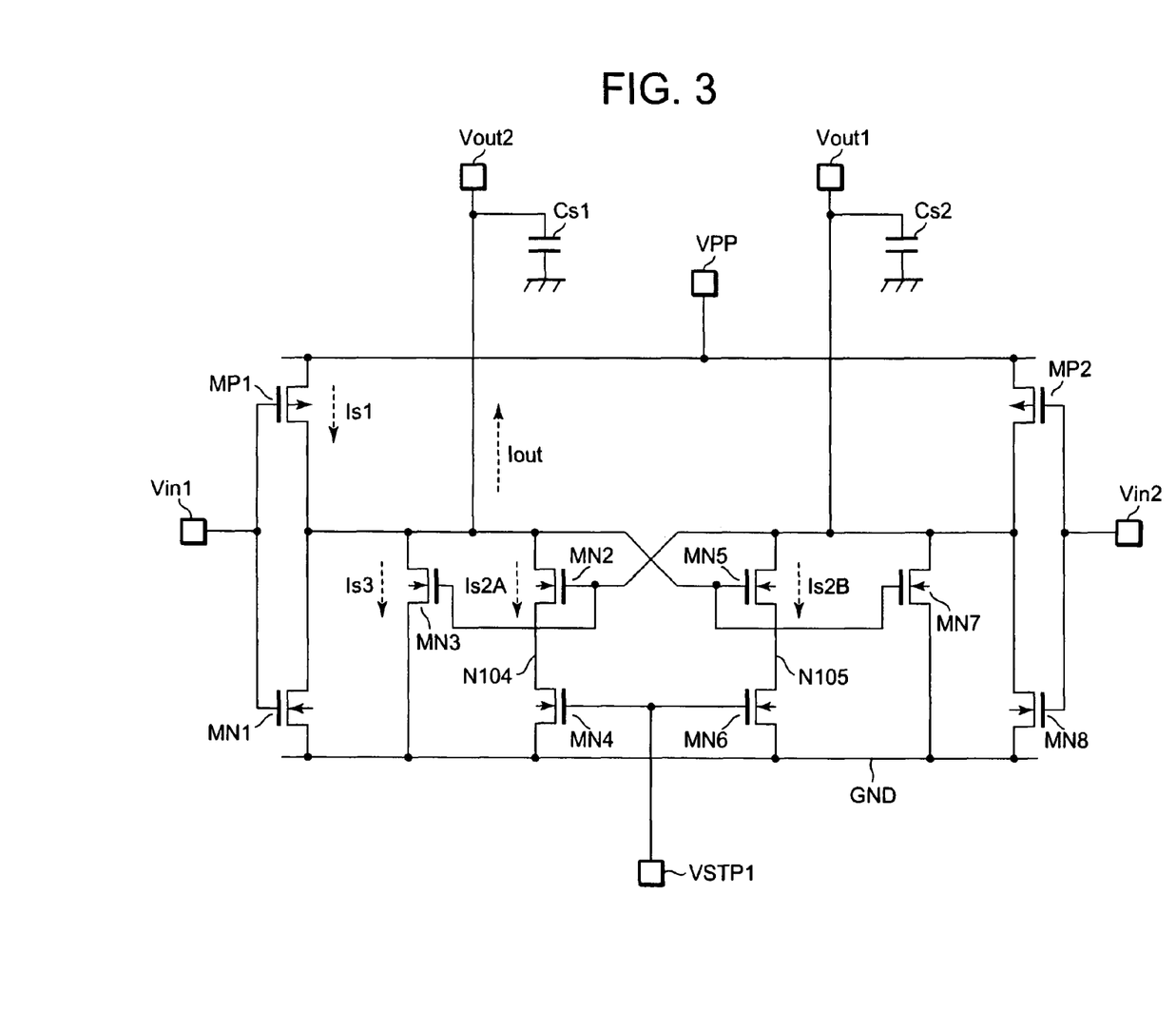
FIG. 3 is a diagram showing a delay circuit according to the first embodiment of the present invention.

FIG. 3 shows a circuit configuration common among the delay circuits 2, 3, 4, 5 shown in FIG. 1, which are delay circuits of the first embodiment of the present invention. The circuit shown in FIG. 3 includes transistors MP1, MP2, MN1, MN2, MN3, MN4, MN5, MN6, MN7, MN8. Here, the transistors MP1, MP2 are P-channel MOS transistors, for instance. In addition, the transistors MN1, MN2, MN3, MN4, MN5, MN6, MN7, MN8 are N-channel MOS transistors, for instance. The transistor MP1 and the transistor MN1 constitute a first amplifier (first inverter). The transistor MP2 and the transistor MN8 constitute a second amplifier (second inverter). The transistor MN2 (first transistor) and the transistor MN3 (third transistor) constitute a third amplifier. The transistor MN5 (second transistor) and the transistor MN7 (fourth transistor) constitute a fourth amplifier. The transistor MN4 is a capability changing switch (first switch element) for the third amplifier. In addition, the transistor MN6 is a capability changing switch (second switch element) for the fourth amplifier.

Here, the transistors MN3, MN7 are oscillation sustaining differential amplifiers configured to sustain an oscillation. In other words, the transistors MN3, MN7 are amplifiers used while an oscillation is stable (in a stable state). Furthermore, the transistors MN2, MN5 are oscillation activation supporting differential amplifiers for assisting the oscillation. In other words, the transistors MN2, MN5 are amplifiers used when the oscillation circuit in the oscillation stop state activates its oscillation (in an oscillation activation state). The input terminal Vin1 is connected to the gate of the transistor MP1 and the gate of the transistor MN1. The source of the transistor MP1 is connected to a high-potential power supply terminal VPP. The source of the transistor MN1 is connected to a ground voltage terminal GND. The drain of the transistor MP1 and the drain of the transistor MN1 are connected to the output terminal Vout2 through a common output node.

The input terminal Vin2 is connected to the gate of the transistor MP2 and the gate of the transistor MN8. The source of the transistor MP2 is connected to the high-potential power supply terminal VPP. The source of the transistor MN8 is connected to the ground voltage terminal GND. The drain of the transistor MP2 and the drain of the transistor MN8 are connected to the output terminal Vout1 through a common output node. The output node common between the drain of the transistor MP1 and the drain of the transistor MN1 is further connected to the gate of the transistor MN5, the gate of the transistor MN7, the drain of the transistor MN3, and the drain of the transistor MN2. The output node common between the drain of the transistor MP2 and the drain of the transistor MN8 is further connected to the gate of the transistor MN2, the gate of the transistor MN3, the drain of the transistor MN7, and the drain of the transistor MN5.

The source of the transistor MN3, the source of the transistor MN7, the source of the transistor MN4 and the source of the transistor MN6 are connected to the ground voltage terminal GND. The drain of the transistor MN4 is connected to the source of the transistor MN2 through a node N104. The gate of the transistor MN4 is connected to a low-potential power supply terminal VSTPI. The drain of the transistor MN6 is connected to the source of the transistor MN5 through a node N105. The gate of the transistor MN6 is connected to the low-potential power supply terminal VSTPI. In addition, reference sign Cs1 denotes a parasitic capacitance between the output terminal Vout2 and an input terminal of another delay circuit at the next stage. Reference sign Cs2 denotes a parasitic capacitance between the output terminal Vout1 and the other input terminal of the delay circuit at the next stage.

Figure 2:
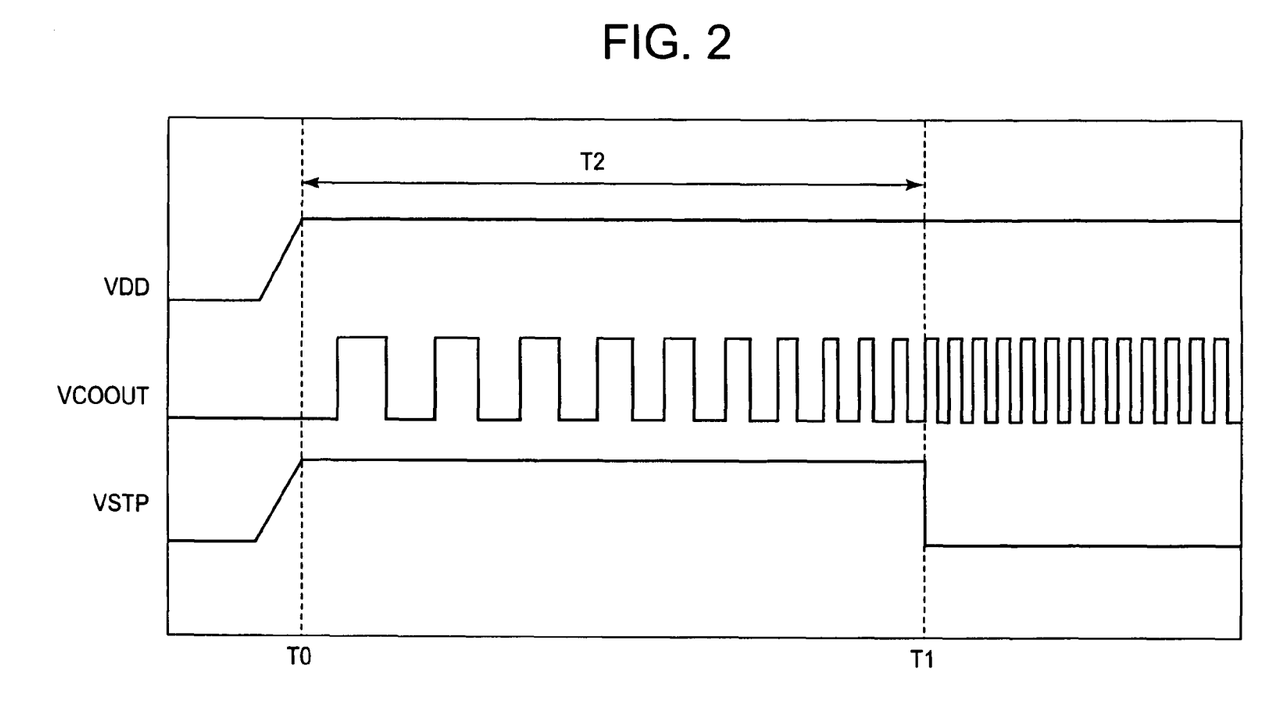
FIG. 2 is a timing chart of the differential oscillation circuit according to the first embodiment of the present invention.

FIG. 2 shows a timing chart of the oscillation activation detector circuit 7. Time point when the power supply voltage VDD rises is denoted by reference sign T0. Time point when oscillation of a signal VCOOUT inputted into the input terminal VIN of the oscillation activation detector circuit 7 becomes stable is denoted by reference sign T1. A time period from the rise of the power supply voltage VDD to the start of a sufficiently stable oscillation is denoted by reference sign T2. As shown in FIG. 2, the oscillation activation detector circuit 7 is a generally-used synchronous counter for counting time point T1, which is triggered by the rise of the signal VCOOUT.

Descriptions will be provided for an operation according to the first embodiment of the present invention by use of FIGS. 1, 2 and 3. First, by use of FIG. 3, descriptions will be provided for a prerequisite for the oscillation circuit shown in FIG. 1 to avoid the oscillation stop state when the oscillation circuit is activated for an oscillation operation. In FIG. 3, when the signals of the input terminals Vin1, Vin2 are both at low level, the transistors MP1, MP2 are turned on. Thereby, high-level signals are supplied to the gates of the respective transistors MN2, MN3, MN5, MN7. Accordingly, the transistors MN2, MN3, MN5, MN7 are turned on.

In this case, the delay circuit needs to have a circuit configuration which makes the phases of the outputs from the output terminals Vout1, Vout2 reverse to each other. Specifically, in order to activate the oscillation of the oscillation circuit in the oscillation stop state, the transistors MN2, MN3 constituting the third amplifier and the transistors MN5, NM7 constituting the fourth amplifier need to have a large differential gain. In other words, the transistors MN2, MN3, MN5, MN7 each need to have a transistor configuration which is capable of sensitively responding to even a minute signal potential difference. In this case, for instance, the transistors MN2, MN5 need to be configured in a large transistor size in order to have a sufficiently large current capability. In this case, the transistors MN2, MN5 are usually configured in a transistor size which is approximately 10 times large.

Next, descriptions will be provided for the oscillation of the oscillation circuit shown in FIG. 1. Once the power supply voltage VDD is applied to the oscillation circuit 1 shown in FIG. 1, an activation detection signal VSTP (an output signal from the output terminal VSTPO of the oscillation activation detector circuit 7) changes to high level. Accordingly, the transistors MN4, MN6 serving as the capability changing switches for the third and fourth amplifiers included in each of the delay circuits 2 to 5 (see FIG. 3) are turned on. At this time, the transistors MN2, MN3 serving as the third amplifier in each of the delay circuits 2 to 5 (see FIG. 3) operate, whereas the transistors MN5, MN7 serving as the fourth amplifier operate. In other words, the third and fourth amplifiers each have an enough current capacity required to activate the oscillation of the oscillation circuit. Thereby, the oscillation circuit 1 is capable of activating its oscillation by amplifying the minute potential difference which exists in the oscillation circuit in the oscillation stop state.

In FIG. 1, once the oscillation circuit 1 starts an oscillation, the differential single-end converter circuit 6 outputs the oscillation signal VCOOUT obtained by converting signals to a single-end signal. As shown in FIG. 2, the oscillation starts at time T0. Then, after the time period T2 taken for stabilizing the oscillation, the oscillation is finally stabilized at time point T1. At time point T1, the oscillation activation detector circuit 7 detects that the oscillation is stabilized, and thus outputs the low-level activation detection signal VSTP. Thereby, the transistors MN4, MN6 shown in FIG. 3 are turned off. Consequently, the transistors MN2, MN5 are turned off as well. In other words, a current Is2A flowing through the transistor MN2 is reduced to zero. Similarly, a current Is2B flowing through the transistor MN5 is reduced to zero. For this reason, in the third amplifier, only the transistor MN3 remains on. Similarly, in the fourth amplifier, only the transistor MN7 remains on.

Consider a case where, at time point T1, a voltage of the input terminal Vin1 of the delay circuit 2 shown in FIG. 1 is at high level whereas the voltage of the input terminal Vin2 thereof is at low level, for instance. In this case, a voltage of the output terminal Vout1 of each of the delay circuits 2, 3, 4, 5 is at high level, whereas a voltage of the output terminal Vout2 of each of the delay circuits 2, 3, 4, 5 is at low level. Subsequently, the voltage of the input terminal Vin1 of the delay circuit 2 changes from high level to low level, because the output terminal Vout1 of the delay circuit 5 is connected to the input terminal Vin2 of the delay circuit 2. In addition, the voltage of the input terminal Vin2 of the delay circuit 2 changes from low level to high level, because the output terminal Vout2 of the delay circuit 5 is connected to the input terminal Vin1 of the delay circuit 2.

Thereby, the voltages of the output terminals Vout1 of the delay circuits 2, 3, 4, 5 sequentially change to low level, whereas the voltages of the output terminals Vout2 of the delay circuits 2, 3, 4, 5 sequentially change to high level, respectively. Thereafter, the feedback changes the voltage of the input terminal Vin1 of the delay circuit 2 from low level to high level again, as well as the voltage of the input terminal Vin2 of the delay circuit 2 from high level to low level again. The oscillation circuit 1 oscillates by repeating these changes. Furthermore, a signal VCOOUT based on the oscillation signals thus generated by oscillation circuit 1 is outputted from the differential single-end converter circuit 6.

As described above, the oscillation circuit according to the first embodiment of the present invention includes, in each of the delay circuits 2, 3, 4, 5 constituting the oscillation circuit 1, the differential amplifiers each having the circuit configuration in which the oscillation activation supporting differential amplifiers (the transistors MN2, MN5) for supporting an oscillation activation and the oscillation sustaining differential amplifiers (the transistors MN3, MN7) configured to sustain an oscillation are connected together in parallel. In addition, the signal VSTP outputted from the oscillation activation detector circuit 7 controls the on and off of the capability changing switches (the transistors MN4, MN6) for controlling the electrical continuity of the oscillation activation supporting differential amplifiers. Thereby, the oscillation circuit is capable of controlling the switch between a current flowing in the oscillation circuit during activation of the oscillation (in the oscillation activation state) and a current flowing in the oscillation circuit while the oscillation lasts (in the stable state). In other words, the present invention is capable of solving a problem with the prior art that the high-speed operation of the oscillation circuit is hindered by the current flowing to operate the differential amplifiers used for an oscillation activation, which is a problem with the prior art.

By use of FIG. 3, descriptions will be provided for a mechanism for solving the problem with the prior art. As shown in FIG. 3, the current Is1 is a drain current flowing through the transistor MP1. The current Is2A is a drain current flowing through the transistor MN2. The current Is2B is a drain current flowing through the transistor MN5. The current Is3 is a drain current flowing through the transistor MN3. The output current Iout is a current flowing to the output terminal Vout2.

The transistor MN3 is constructed so as to have the transistor size approximately one tenth of that of the transistor MN2, for instance. In this respect, as the transistor size becomes larger, the electric capability becomes sufficiently larger. For this reason, a relationship between the currents Is2A, Is3 in terms of the current value is expressed with Is2A>>Is3. Similarly, the transistor MN7 is constructed so as to have the transistor size approximately one tenth of that of the transistor MN5, for instance. Note that an output current flowing to the output terminal Vout1 is similar to the output current Iout flowing to the output terminal Vout2, and thus the description thereof is omitted.

In this respect, the oscillation frequency of the oscillation circuit (see FIG. 1) is determined on the basis of the output current Iout and the capacitance Cs1. In general, the frequency increases in proportion to the current, while in inverse proportion to the capacitance. In the delay circuit shown in FIG. 3, when the third amplifier (the transistors MN2, MN3) is on, a current (expressed with Is2A+Is3) flows in the third amplifier. At this time, the output current Iout flowing to the output terminal Vout2 decreases. Specifically, the output current Iout can be expressed with Is1−(Is2A+Is3). In the case shown in FIG. 3, the output current Iout decreases due to the current (Is2A+Is3) flowing in the third amplifier when the voltage of the output terminal Vout2 changes from low level to high level, that is, when the voltage of the output terminal Vout1 changes from high level to low level. In this respect, as the current flowing through the third amplifier becomes larger, the upper limit of the oscillation frequency becomes lower. In other words, the oscillation frequency is hindered from increasing its speed.

In FIG. 1, once the oscillation circuit 1 starts an oscillation, the differential single-end converter circuit 6 outputs the oscillation signal VCOOUT having the oscillation frequency obtained by converting signals into a single-end signal. As shown in FIG. 2, the oscillation starts at time T0. Then, after the time period T2 taken for stabilizing the oscillation, the oscillation is finally stabilized at time point T1. At time point T1, the oscillation activation detector circuit 7 detects that the oscillation is stabilized, and thus outputs the low-level activation detection signal VSTP. Thereby, the transistors MN4, MN6 shown in FIG. 3 are turned off. Consequently, the transistors MN2, MN5 are turned off as well.

When the voltage of the output terminal Vout1 changes from high level to low level, the current Is2A flowing through the transistor MN2 is reduced to zero because the transistor MN4 is off. At this time, it is only the current Is3 from the transistor MN3 that flows to the ground voltage terminal GND from the third amplifier. Specifically, only a current whose amount is approximately one tenth of the amount of a current flowing through the transistor MN2 flows through the third amplifier. Consequently, when the voltage of the output terminal Vout2 changes from low level to high level, relationship between the currents Is1, Is3 in terms of the current value is expressed with Is1>>Is3. In other words, the current Iout whose value is substantially equal to that of the current Is1 flows to the output terminal Vout2. While the oscillation is stable, as described above, the oscillation circuit according to the first embodiment is capable of reducing the amount of a current flowing through the third amplifier in comparison with the oscillation circuit according to the prior art by controlling the transistor MN4 such that the transistor MN 4 be turned off. Accordingly, the upper limit of the oscillation frequency can be raised. In other words, the oscillation circuit according to the first embodiment is capable of increasing the oscillation frequency.

Embodiment 2 of the Invention

Figure 4:
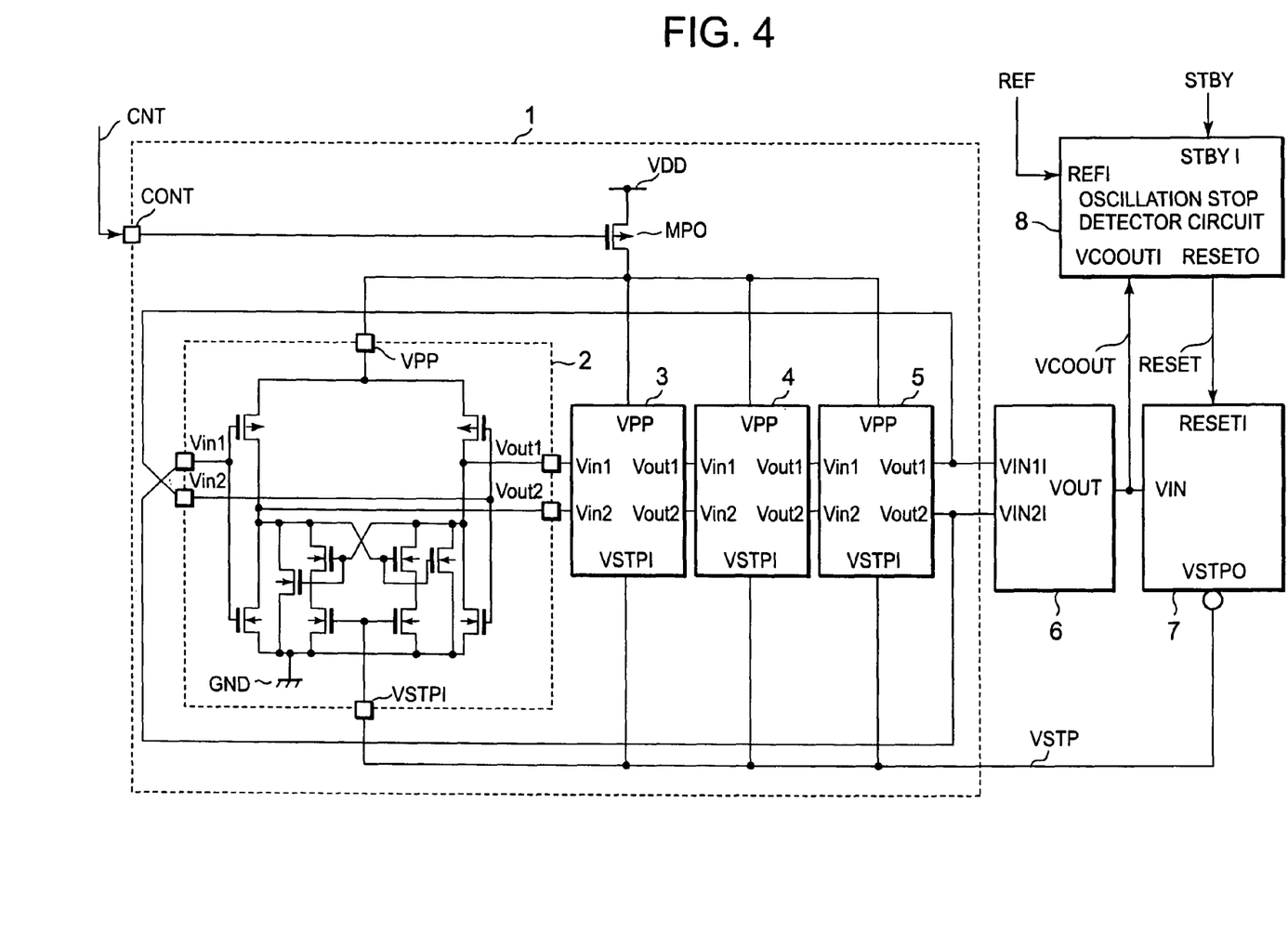
FIG. 4 is a diagram showing a differential oscillation circuit according to a second embodiment of the present invention.

FIG. 4 shows a differential oscillation circuit (an oscillation circuit) according to a second embodiment of the present invention. FIG. 4 shows a circuit configuration resulting from adding an oscillation stop detector circuit 8 to the differential oscillation circuit according to the first embodiment of the present invention. In the oscillation stop detector circuit 8, a reference signal REF is inputted into an input terminal REFI, and a reset signal STBY for initializing flip-flop circuits included in the oscillation stop detector circuit 8 is inputted into a reset terminal STBYI. In this respect, the reference signal REF is a reference signal used in a PLL and the like for matching phases. An output terminal RESETO of the oscillation stop detector circuit 8 is connected to an input terminal RESETI of the oscillation activation detector circuit 7. Note that a signal outputted from the output terminal RESETO of the oscillation stop detector circuit 8 is denoted by reference sign RESET. The output terminal VOUT of the differential single-end converter circuit 6 is connected to the input terminal VIN of the oscillation activation detector circuit 7, and additionally to an input terminal VCOOUTI of the oscillation stop detector circuit 8.

Figure 5:
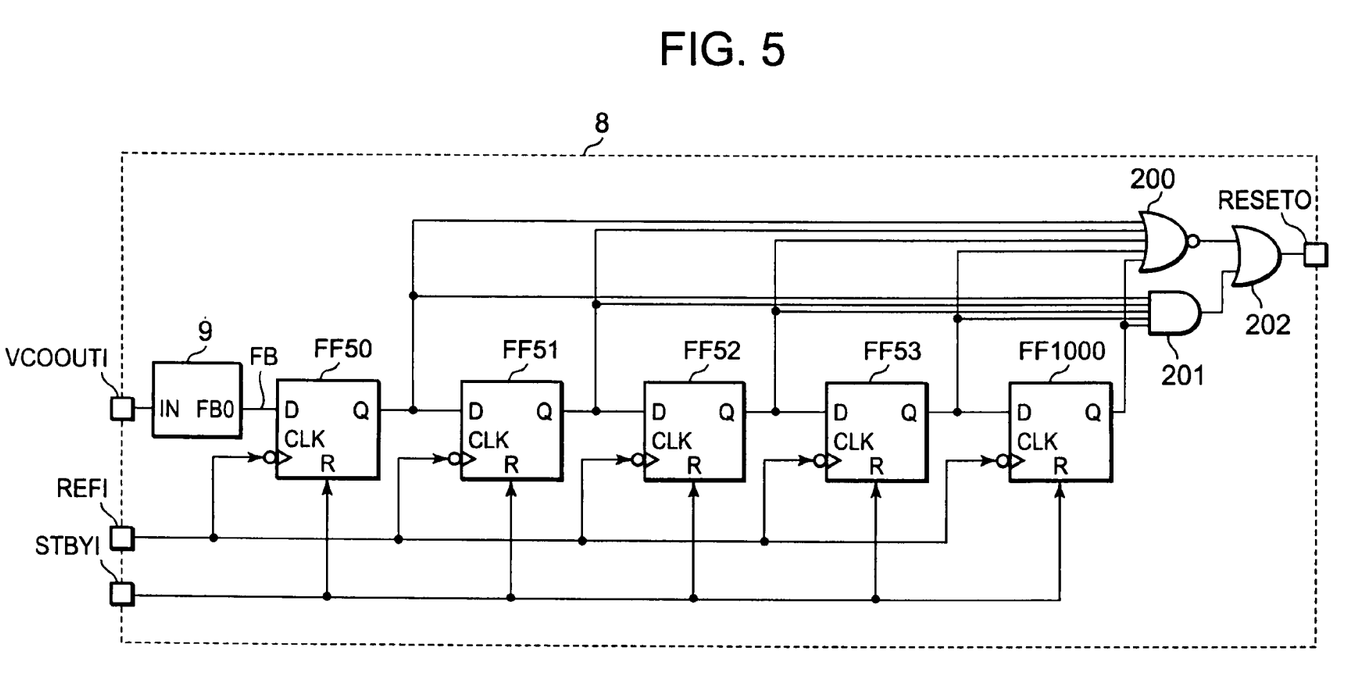
FIG. 5 is a diagram showing an oscillation stop detector circuit according to the second embodiment of the present invention.

The circuit configuration according to embodiment 2 other than the oscillation stop detector circuit 8 is the same as that according to the first embodiment, and thus the description thereof is omitted. The circuit configuration of the oscillation stop detector circuit 8 can be easily achieved by use of a circuit configuration shown in FIG. 5, for instance. FIG. 5 shows an example of the oscillation stop detector circuit 8. The circuit shown in FIG. 5 includes: five flip-flops FF50, FF51, FF52, FF53, FF1000 needed to check whether or not an oscillation stops; a NOR circuit 200 (hereinafter referred to as a "NOR 200"); an AND circuit 201 (hereinafter referred to as an "AND 201"); an OR circuit 202 (hereinafter referred to as an "OR 202"); and a frequency halving circuit 9. This circuit configuration is shown merely as an example of a circuit configuration, and may be modified when deemed necessary, without departing from the scope of the present invention. For instance, the oscillation stop detector circuit 8 according to the second embodiment of the present invention includes five flip-flop circuits, but the number of flip-flop circuits is not limited to five. For example, a circuit configuration including as many flip-flop circuits as necessary to correspond to a predetermined clock cycle determined by the design specification and the like may also be applicable.

The input terminal REFI is connected to input terminals CLK of the respective flip-flops FF50, FF51, FF52, FF53, FF1000. The input terminal STBYI is connected to reset terminals R of the respective flip-flops FF50, FF51, FF52, FF53, FF1000.

The input terminal VCOOUTI is connected to the input terminal IN of the frequency halving circuit 9. The output terminal FBO of the frequency halving circuit 9 is connected to the input terminal D of the flip-flop FF50. Note that the frequency halving circuit 9 is a generally-used frequency halving circuit. This frequency halving circuit 9 halves the frequency of the signal VCOOUT outputted from the differential single-end converter circuit 6, and thus outputs the frequency-halved signal. In this respect, the signal outputted from the frequency halving circuit 9 is denoted by reference sign FB. The output terminal Q of the flip-flop FF50 is connected to the input terminal D of the flip-flop FF51. The output terminal Q of the flip-flop FF51 is connected to the input terminal D of the flip-flop FF52. The output terminal Q of the flip-flop FF52 is connected to the input terminal D of the flip-flop FF53. The output terminal Q of the flip-flop FF53 is connected to the input terminal D of the flip-flop FF1000.

In addition, the output terminals Q of the flip-flop terminals FF50, FF51, FF52, FF53, FF1000 are connected to the input terminals of the NOR 200 and the input terminals of the AND

201, respectively. The output terminal of the NOR 200 is connected to one input terminal of the OR 202. The output terminal of the AND 201 is connected to the other input terminal of the OR 202. The output terminal of the OR 202 is connected to the output terminal RESETO.

Figure 6:
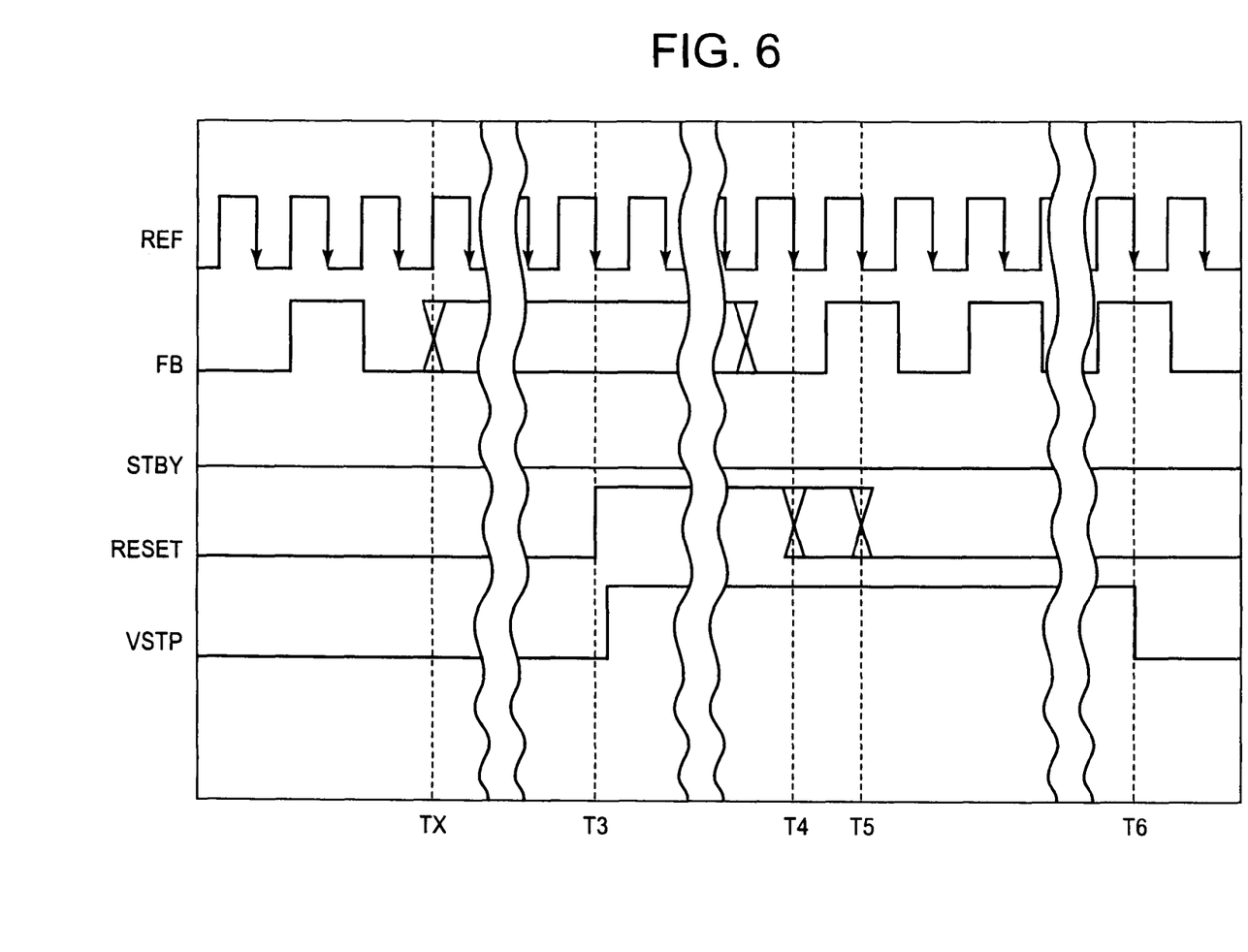
FIG. 6 is a timing chart of a differential oscillation circuit according to the second embodiment of the present invention.

By use of the FIGS. 5 and 6, descriptions will be provided for how the differential oscillation circuit according to the second embodiment of the present invention operates. FIG. 6 is a timing chart of the differential oscillation circuit according to the second embodiment of the present invention. In this respect, the output signal FB froth the frequency halving circuit 9 is outputted triggered by a rise edge of the output signal VCOOUT from the differential single-end converter circuit 6.

TX denote time point when the oscillation circuit 1 shown in FIG. 4 stops its oscillation due to things such as noise which occurs in the semiconductor chip and noise which comes from the outside of the semiconductor chip (hereinafter referred to as "external noise"). In addition, the number of clock cycles (five clock cycles in the present embodiment) needed to check whether or not the oscillation stops is counted by the flip-flops FF50, FF51, FF52, FF53, F1000. T3 denotes time point when the output signal RESET turns to high level (indicating the oscillation stop) after the count. T4 denote time point when the output signal FB from the frequency halving circuit 9 is read as low-level data, in response to a fall edge of the reference signal REF as the reference clock after the oscillation circuit 1 again activates its oscillation. T5 denotes time point when the output signal FB from the frequency halving circuit 9 is read as high-level data after time T4. Note that the detection of time points T4, T5 makes it possible to recognize that the oscillation circuit 1 resumes the oscillation. T6 denotes time point when the output signal VSTP from the oscillation activation detector circuit 7 turns to low level after a predetermined time period passes until the oscillation becomes stable.

When the oscillation circuit 1 stops the oscillation due to the influence of the external noise and the like, the output signal VCOOUT from the differential single-end converter circuit 6 shown in FIG. 4 is fixed at either the high or low level. In this case, the output signal FB from the frequency halving circuit 9 is accordingly fixed at either the high or low level.

First of all, descriptions will be provided for how the oscillation circuit operates when the output signal FB from the frequency halving circuit 9 is fixed at low level. In this case, the oscillation is judged as stopping, when five clock cycles of the reference clock REF shows that the output signal FB is fixed at either the high or low level. When the output signal FB is fixed at low level, the low-level signal is inputted into the input terminal D of the flip-flop FF50 as show in FIG. 5. The low-level signal is outputted from the output terminal Q of the flip-flop FF50. The low-level signal is inputted into the input terminal D of the flip-flop FF51. The low-level signal is similarly outputted from the output terminals Q of the respective flip-flops FF51, FF52, FF53, FF1000. Thereby, the high-level signal is outputted from the NOR 200.

As described above, the low-level signal is outputted from the output terminals Q of the respective flip-flops included in the oscillation stop detector circuit 8. Consequently, the low-level signal is outputted from the AND 201. Thereby, the high-level signal is outputted from the OR 202. In other words, the output signal RESET of the oscillation stop detector circuit 8 is at high level (at time point T3 in FIG. 6). As shown in FIG. 4, this high-level output signal RESET initializes the oscillation activation detector circuit 7. Once the oscillation activation detector circuit 7 is initialized, the signal VSTP again indicates high level. In other words, the transistors MN4, MN6 included in each of the delay circuits 2 to 5 (see FIG. 3) are turned on. Thereby, the drain current Is2A flows through the transistor MN2 constituting the third amplifier. Similarly, the drain current Is2B flows through the transistor MN5 constituting the fourth amplifier. Accordingly, the third and fourth amplifiers regain their current capabilities needed for the oscillation activation. This allows the oscillation circuit 1 in the oscillation stop state to amplify the minute potential difference and to activate the oscillation again.

Once the oscillation circuit 1 starts its oscillation activation, the output signal VCOOUT from the differential signal-end converter circuit 6 starts its oscillation as well. Thus, the output signal FB from the frequency halving circuit 9, which has been fixed at low level, turns to high level (at time point T5 in FIG. 6). Hence, the high-level signal is inputted into the input terminal D of the flip-flop FF50. The high-level signal is outputted from the output terminal Q of the flip-flop FF50. Thereby, the low level signal is outputted from the NOR 200. In addition, after the oscillation starts, the high-level signal FB and the low-level signal FB are alternately outputted in response to each fall edge of the reference clock REF. For this reason, one of the signals inputted into the NOR 200 is at high level.

Consequently, the low-level signal is always outputted from the NOR 200. Similarly, one of the signals inputted into the AND 201 is at low level. Consequently, the low-level signal is always outputted from the AND 201. Thereby, the low-level signal is outputted from the OR 202. In other words, the output signal RESET from the oscillation stop detector circuit 8 is at low level (at time point T6 in FIG. 6). Thus, even when the oscillation circuit 1 stops its oscillation due to the influence of the external noise and the like, the oscillation circuit 1 is capable of reactivating the oscillation.

Next, descriptions will be provided for how the oscillation circuit according to the second embodiment operates when the output signal FB from the frequency halving circuit 9 is fixed at high level. As shown in FIG. 5, when the output signal FB is fixed at high level, the high-level signal is inputted into the input terminal D of the flip-flop FF50. The high-level signal is outputted from the output terminal Q of the flip-flop FF50. Thereafter, the high-level signal is inputted into the input terminal D of the flip-flop FF51. The high-level signal is similarly outputted from the output terminals Q of the respective flip-flops FF51, FF52, FF53, FF1000. Thereby, the low-level signal is outputted from the NOR 200.

As described above, the high-level signal is outputted from the output terminals Q of the respective flip-flops included in the oscillation stop detector circuit 8. Consequently, the high-level signal is outputted from the AND 201. Thereby, the high-level signal is outputted from the OR 202. In other words, the output signal RESET of the oscillation stop detector circuit 8 is at high level (at time point T3 in FIG. 6). As shown in FIG. 4, this high-level output signal RESET initializes the oscillation activation detector circuit 7. Once the oscillation activation detector circuit 7 is initialized, the signal VSTP again indicates high level. In other words, the transistors MN4, MN6 included in each of the delay circuits 2 to 5 (see FIG. 3) are turned on. Thereby, the drain current Is2A flows through the transistor MN2 constituting the third amplifier. Similarly, the drain current Is2B flows through the transistor MN5 constituting the fourth amplifier. Accordingly, the third and fourth amplifiers regain their current capabilities needed for the oscillation activation. This allows the oscillation circuit 1 in the oscillation stop state to amplify the minute potential difference and to activate the oscillation again.

Once the oscillation circuit 1 starts its oscillation activation, the output signal VCOOUT from the differential signal-end converter circuit 6 starts its oscillation as well. Thus, the output signal FB from the frequency halving circuit 9, which has been fixed at high level, turns to low level (at time point T5 in FIG. 6). Hence, the low-level signal is inputted into the input terminal D of the flip-flop FF50. The low-level signal is outputted from the output terminal Q of the flip-flop FF50. After the oscillation starts, the high-level signal'FB and the low-level signal FB are alternately outputted in response to each fall edge of the reference clock REF. For this reason, one of the signals inputted into the NOR 200 is at high level. Consequently, the low-level signal is always outputted from the NOR 200. Similarly, one of the signals inputted into the AND 201 is at low level. Accordingly, the low-level signal is always outputted from the AND 201. Thereby, the low-level signal is outputted from the OR 202. In other words, the output signal RESET from the oscillation stop detector circuit 8 is at low level (at time point T6 in FIG. 6). Thus, even when the oscillation circuit 1 stops its oscillation due to the influence of the external noise and the like, the oscillation circuit 1 is capable of reactivating the oscillation.

As described above, the differential oscillation circuit according to the second embodiment of the present invention detects whether the output signal VCOOUT from the differential single-end converter circuit 6 continues or stops its oscillation by use of the oscillation stop detector circuit 8 shown in FIG. 4. In this respect, if the differential oscillation circuit detects the output signal VCOOUT stops its oscillation, the differential oscillation circuit turns the signal VSTP to high level, again, by initializing the oscillation activation detector circuit 7. Thereby, the transistors MN4, MN6 shown in FIG. 3 are turned on again. In other words, the current Is2A flows through the transistor MN2. Similarly, the current Is2B flows through the transistor MN5. To put it the other way, the third and fourth amplifiers included in each of the delay circuits 2 to 5 regain their current capabilities needed for the oscillation activation. This allows the oscillation circuit 1 in the oscillation stop state to amplify the minute potential difference and to activate the oscillation again.

Note that the present invention is not limited to the foregoing embodiments, and that the present invention can be modified as appropriate without departing from the scope of the present invention. For instance, the foregoing embodiments have been described using a case where the oscillation circuit 1 includes the delay circuits 2 to 5, in each of which one terminal of each of the third and fourth amplifiers is connected to the ground voltage terminal GND. However, the present invention is not limited to this case. The present invention can be embodies as an oscillation circuit having a circuit configuration in which one terminal of each of the third and fourth amplifiers is connected to the high-potential power supply terminal VPP, for instance. Otherwise, the present invention can be embodied as an oscillation circuit including: the third and fourth amplifiers, one terminal of each of which is connected to the ground voltage terminal GND; and additionally fifth and sixth amplifiers, one terminal of each of which is connected to the high-potential power supply terminal VPP. In this case, note that the fifth and sixth amplifiers have the same circuit configuration as do the third and fourth amplifiers.

In addition, the foregoing embodiments of the present invention have been described as the oscillation circuit 1 having the circuit configuration including: the transistors MN2, MN3 as the third amplifier; and the transistors MN5, MN7 as the fourth amplifier. The present invention is not limited to these embodiments. For instance, the present invention can be embodied as an oscillation circuit having a circuit configuration including: only the transistor MN2 as the third amplifier; and only the transistor MN5 as the fourth amplifier. This circuit configuration makes the current Iout substantially equal to the current Is1 during the stable oscillation (in a stable state) after the oscillation activation. This circuit configuration raises the upper limit value of the oscillation frequency. In other words, the oscillation circuit having this circuit configuration is capable of speeding up its oscillation frequency.

Furthermore, the foregoing embodiments of the present invention have been described as the oscillation circuit having the circuit configuration including: the transistor MN4 as the capability changing switch for the third amplifier; and the transistor MN6 as the capability changing switch for the fourth amplifier. The present invention is not limited to these embodiments. For instance, the present invention can be embodied as an oscillation circuit having a circuit configuration including a common switch element (for instance, an N-channel transistor) for switching the capabilities of the third and fourth amplifiers.

What is claimed is:

1. A differential oscillation circuit including a feedback loop circuit, comprising:
   delay circuits, cascade-connected one after another on the feedback loop circuit, each delay circuit configured to delay paired differential input signals which the delay circuit receives, and to output the delayed differential signals as paired differential output signals;
   an oscillation activation detector circuit configured to detect whether the oscillation circuit is in an oscillation activation state or in a stable state, and to output a detection signal indicating a result of the detection,
   wherein, on a basis of the detection signal outputted from the oscillation activation detector circuit, each of the delay circuits controls output current values of the differential output signals; and
   an oscillation stop detector circuit configured to detect that the oscillation circuit stops its oscillation, and to output a reset signal,
   wherein on a basis of the reset signal, the oscillation activation detector circuit outputs a detection result as the detection signal, the detection result indicating that the oscillation circuit is in the oscillation activation state.

2. The oscillation circuit according to claim 1, wherein a delay circuit of said delay circuits includes:
   a pair of first and second inverters configured to invert the respective differential input signals, and to output the respective inverted differential signals;
   a first transistor connected between an output node of the first inverter and a power supply voltage terminal, on and off of the first transistor controlled on a basis of a voltage of an output node of the second inverter;
   a second transistor connected between the output node of the second inverter and the power supply voltage terminal, on and off of the second transistor controlled on a basis of a voltage of the output node of the first inverter; and
   a switch circuit connected in series to the first transistor between the output node of the first inverter and the power supply voltage terminal, and connected in series to the second transistor between the output node of the second inverter and the power supply voltage terminal, on and off of the switch circuit controlled on a basis of the detection signal.

3. The oscillation circuit according to claim 2, wherein
when the oscillation circuit is in the oscillation activation state, the switch circuit of the delay circuit is controlled so that the switch circuit is turned on, in accordance with the detection signal, and
when the oscillation circuit is in the stable state, the switch circuit of the delay circuit is controlled so that the switch circuit is turned off, in accordance with the detection signal.

4. The oscillation circuit according to claim 2, wherein the delay circuit further includes:
a third transistor connected between the output node of the first inverter and the power supply voltage terminal, on and off of the third transistor controlled on a basis of the voltage of the output node of the second inverter, the third transistor having a larger on-resistance than the first transistor; and
a fourth transistor connected between the output node of the second inverter and the power supply voltage terminal, on and off of the fourth transistor controlled on a basis of the voltage of the output node of the first inverter, the fourth transistor having a larger on-resistance than the second transistor.

5. The oscillation circuit according to claim 2, wherein the switch circuit includes:
a first switch element connected to the first transistor in series, on and off of the first switch element controlled in accordance with the detection signal; and
a second switch element connected to the second transistor in series, on and off of the second switch element controlled in accordance with the detection signal.

6. The oscillation circuit according to claim 5, wherein
the power supply voltage terminal comprises a low-potential power supply voltage terminal, and
each of the first to fourth transistors and the first to second switch elements comprises an N-channel MOS transistor.

7. The oscillation circuit according to claim 5, wherein the power supply voltage terminal comprises a high-potential power supply voltage terminal, and
each of the first to fourth transistors and the first to second switch elements comprises a P-channel MOS transistor.

* * * * *